United States Patent
Norton

(10) Patent No.: US 9,927,833 B2
(45) Date of Patent: Mar. 27, 2018

(54) MOTHERBOARD WITH A HOLE

(71) Applicant: Hewlett-Packard Development Company, L.P., Houston, TX (US)

(72) Inventor: John Norton, Houston, TX (US)

(73) Assignee: Hewlett Packard Enterprise Developement LP, Houston, TX (US)

( * ) Notice: Subject to any disclaimer, the term of this patent is extended or adjusted under 35 U.S.C. 154(b) by 0 days.

(21) Appl. No.: 14/907,117

(22) PCT Filed: Jul. 22, 2013

(86) PCT No.: PCT/US2013/051515
§ 371 (c)(1),
(2) Date: Jan. 22, 2016

(87) PCT Pub. No.: WO2015/012796
PCT Pub. Date: Jan. 29, 2015

(65) Prior Publication Data
US 2016/0154422 A1    Jun. 2, 2016

(51) Int. Cl.
*G06F 1/16* (2006.01)
*H05K 1/18* (2006.01)
(Continued)

(52) U.S. Cl.
CPC ............... *G06F 1/16* (2013.01); *H05K 1/18* (2013.01); *H05K 3/30* (2013.01); *H05K 3/103* (2013.01);
(Continued)

(58) Field of Classification Search
CPC .......... H05K 1/18; H05K 1/184; H05K 3/103; H05K 3/30; H05K 3/4046;
(Continued)

(56) References Cited

U.S. PATENT DOCUMENTS 5,768,099 A * 6/1998 Radloff ................... G06F 1/184
                                                    360/137
6,573,620 B1 * 6/2003 Craig ..................... H05K 1/141
                                                    307/130
(Continued)

FOREIGN PATENT DOCUMENTS

KR    20080082365 A    9/2008
TW         429188     5/2012

OTHER PUBLICATIONS

International Searching Authority, The International Search Report and the Written Opinion, dated Mar. 19, 2014 for PCT/US2013/051515, filed Jul. 22, 2013, 10 Pages.
(Continued)

*Primary Examiner* — Hoa C Nguyen
*Assistant Examiner* — Christopher L Augustin
(74) *Attorney, Agent, or Firm* — International IP Law Group, PLLC

(57) ABSTRACT

A printed circuit board (PCB) can include a central processing unit (CPU) installed on a first surface of the PCB. The PCB can also include a cable routed on a second surface of the PCB parallel to the first surface. The PCB can further include a hole extending through a thickness of the PCB to connect the first surface and the second surface. The cable can extend through the hole to be coupled to the CPU.

17 Claims, 5 Drawing Sheets

(51) Int. Cl.
*H05K 3/30* (2006.01)
*H05K 3/10* (2006.01)
*H05K 3/40* (2006.01)

(52) U.S. Cl.
CPC . *H05K 3/4046* (2013.01); *H05K 2201/09063* (2013.01); *H05K 2201/10287* (2013.01); *H05K 2201/10719* (2013.01); *H05K 2201/10962* (2013.01)

(58) Field of Classification Search
CPC .......... H05K 2201/09063; H05K 2201/10587; H05K 2201/10719; H05K 2201/10962; H05K 1/0222; H05K 1/0225; H05K 1/0228; H05K 1/0246; H05K 1/0251; H05K 1/115; G06F 1/183; G06F 1/184
See application file for complete search history.

(56) References Cited

U.S. PATENT DOCUMENTS

| | | | |
|---|---|---|---|
| 6,651,322 B1 | 11/2003 | Currie | |
| 6,814,583 B1 | 11/2004 | Young et al. | |
| 7,072,185 B1 | 7/2006 | Belady et al. | |
| 7,279,634 B1 * | 10/2007 | Chang | G06F 1/189 174/50.5 |
| 7,816,779 B2 * | 10/2010 | Braunisch | H01L 25/0657 257/691 |
| 8,338,713 B2 * | 12/2012 | Fjelstad | H01R 12/523 174/251 |
| 8,353,101 B2 | 1/2013 | Gurumurthy et al. | |
| 2002/0018339 A1 * | 2/2002 | Uzuka | G06F 1/184 361/796 |
| 2002/0059721 A1 | 5/2002 | Crudo et al. | |
| 2002/0065971 A1 * | 5/2002 | Farnworth | G06F 1/184 710/301 |
| 2003/0196749 A1 | 10/2003 | Japp et al. | |
| 2006/0067066 A1 * | 3/2006 | Meier | G06F 1/184 361/785 |
| 2009/0288874 A1 | 11/2009 | Dudnikov, Jr. et al. | |
| 2013/0078824 A1 | 3/2013 | Sun et al. | |

OTHER PUBLICATIONS

Vartersian, Jon, "Fabricating Printed Circuit Boards," (Research Paper), Mar. 25, 2002, Newnes an imprint of Elsevier Science, 251 pages.

* cited by examiner

100

500

MOTHERBOARD WITH A HOLE

CROSS-REFERENCE TO RELATED APPLICATION

Pursuant to 35 U.S.C. § 371, this application is a United States National Stage Application of International Patent Application No. PCT/US2013/051515, filed on Jul. 22, 2013, the contents of which are incorporated by reference as if set forth in their entirety herein.

BACKGROUND

A motherboard is a printed circuit board (PCB) to which main components of a computing device are coupled. Examples of main components include a central processing unit (CPU) and memory. The motherboard can also include connectors for peripheral devices (e.g., I/O devices).

BRIEF DESCRIPTION OF THE DRAWINGS

Certain exemplary embodiments are described in the following detailed description and in reference to the drawings, in which.

DETAILED DESCRIPTION OF SPECIFIC EMBODIMENTS

Embodiments disclosed herein provide techniques for installing CPUs in a motherboard. As data transfer rates increase and push the limits of achievable speeds in standard PCBs, the ability to connect high-speed cables directly to central processing units (CPUs) becomes increasingly important as connecting cables directly to CPUs enables routing of high speed signals without suffering the signal losses incurred when first routing through a PCB.

Currently, cables are routed on top surfaces of motherboards, along with the other components of the motherboards. However, cables on densely packed motherboards can interfere with daughter cards and components. In addition, with the decreasing size of motherboards to meet the demands of increasingly smaller computing devices, cables routed on top of a motherboard consume valuable space on the motherboard. Further, routing the cables after connecting the cables to CPUs, and other components, can cause damage to the delicate components.

However, by adding holes extending through the motherboard, these cables can be routed on the bottom side of the motherboards and extended through the holes to the top surface for connecting to components. By routing the cables on the bottom surface of the motherboard, the additional space becomes available on the top surface of the motherboard. This space can be occupied by additional components, or the overall size of the motherboard can be decrease. Further, the cables can be pre-routed on the bottom surface of the motherboard before installation of the components, reducing the risk of damage to the components caused by routing the cables.

Figure 1A:
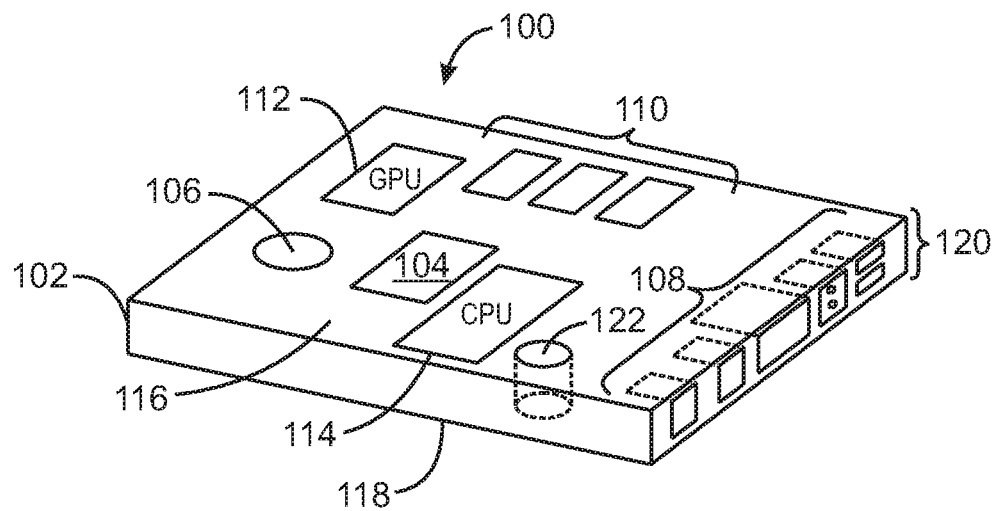
FIG. 1a is a top view illustration of an example of a motherboard.
Figure 1B:
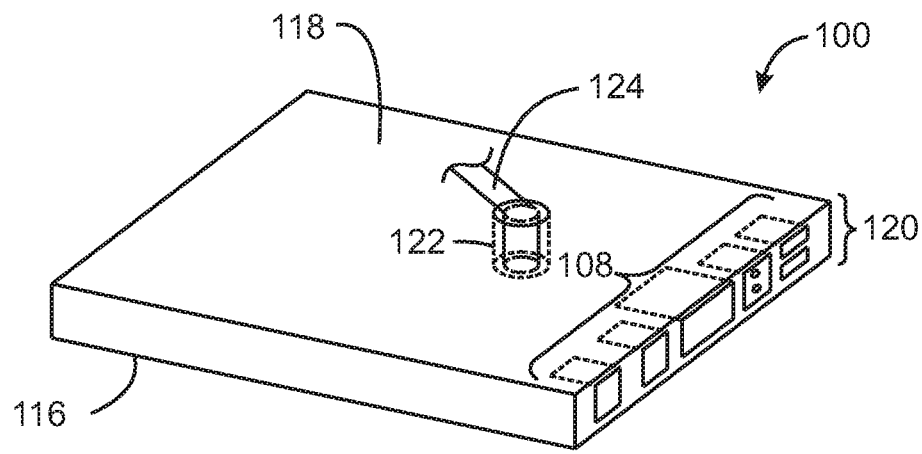
FIG. 1b is a bottom view illustration of an example of a motherboard.

FIG. 1a is a top view illustration of an example of a motherboard 100 and FIG. 1b is a bottom view illustration of an example of the motherboard 100. The motherboard 100 can include a printed circuit board (PCB) 102. A plurality of components can be electrically coupled to the PCB 102. Examples of components include a BIOS chip 104, a backup battery 106, peripheral connectors 108, such as universal serial buses (USBs), serial ports, parallel ports, audio ports, ethernet ports, etc., memory 110, and a graphics processor 112, among others. The motherboard can also include a central processing unit 114. The central processing unit 114 can include a single processor or a plurality of processors. The processor(s) can include any suitable type of processor.

The PCB can include a first surface 116 and a second surface 118 joined by a thickness 120 of the motherboard 100. A hole 122 can extend between the first surface 116 and the second surface 118 through the thickness 120 of the motherboard. While only a single hole 122 is shown in FIGS. 1a and 1b, the motherboard 100 can include any number of holes 122. For example, the motherboard 100 can include a number of holes 122 suitable to allow coupling of each of the components 104-114 of the motherboard 100. The hole 122 can be formed in the PCB 102 through any suitable means. For example, the hole can be formed in the PCB 102 through drilling or through molding. The hole 122 can be any suitable size and shape. For example, the hole 122 can be sized to allow a cable to pass through. In another example, the hole can be sized to allow a connector to pass through.

A cable 124 can be routed on the second surface 118 of the motherboard 100. In an example, the cable can be installed on the second surface 118 of the PCB 102 before the components 104-114 are installed on the first surface 116 of the PCB 102. The cable 124 can extend into the hole 122 to be coupled to the CPU 114. The cable 124 can be coupled to the CPU in any suitable manner, such as through soldering or via a connector. In another example, an adapter coupled to the CPU 114 an extend through the hole 122 to be received in a socket coupled to the cable 124. While a single cable is shown here, the motherboard 100 can include any suitable number of cables 124.

It is to be understood that the illustrations of FIGS. 1a and 1b are not intended to indicate that the motherboard 100 is to include all of the components shown in FIGS. 1a and 1b in every case. Further, any number of additional components can be included within the motherboard 100, depending on the details of the specific implementation.

Figure 2:
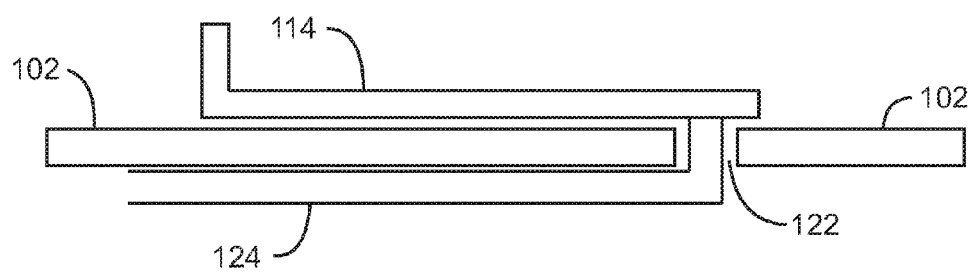
FIG. 2 is a side view illustration of an example of a motherboard.

FIG. 2 is a side view illustration of an example of a motherboard 100. The motherboard 100 includes a PCB 102. The CPU 114 can be installed on the first surface of the PCB 102. The CPU 114 can be coupled to a cable 124. The cable 124 can coupled the CPU 114 to another component not shown here. The cable 124 can be installed on the PCB 102 before the CPU 114 is installed. Further, the cable 124 can be installed before any of components 104-112 are installed. The cable 124 can be routed on the second surface of the PCB 102. The hole 122 can extend through the PCB 122. The cable 124 can extend through the hole 122 to be coupled to the CPU 114. The cable 124 can be coupled to the CPU 114 through any suitable means.

It is to be understood that the illustration of FIG. 2 is not intended to indicate that the motherboard 200 is to include all of the components shown in FIG. 2 in every case. Further, any number of additional components can be included within motherboard 200, depending on the details of the specific implementation.

Figure 3:
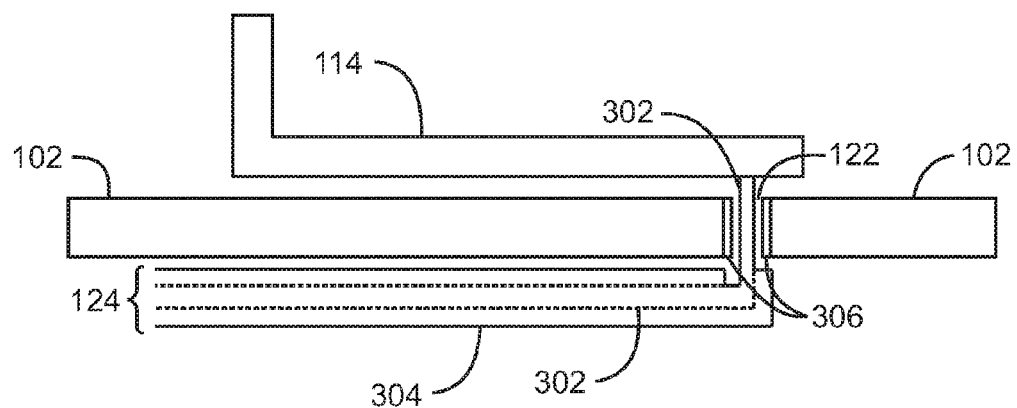
FIG. 3 is another side view illustration of an example of a motherboard.

FIG. 3 is a side view illustration of an example of a motherboard 100. The motherboard 100 includes a PCB 102. The CPU 114 can be installed on the first surface of the PCB 102. The cable 124 can be routed on the second surface of the PCB 102. The cable 124 can include a conductor 302, or a plurality of conductors, and a housing 304 to insulate the conductor(s) from the power and ground planes of the motherboard 100. The cable 124 can be installed on the PCB 102 before the CPU 114 is installed. Further, the cable 124 can be installed before any of components 104-112 are installed.

The hole 122 can extend through the PCB 122 and can include a lining 306 of an insulating material. The lining 306 can include any suitable type of insulating material. For example, the lining 306 can include an insulating material to insulate the conductor 302 from the power and ground planes of the motherboard 100. A portion of the housing 304 can be removed from the conductor 302. The conductor 302, without the housing 304, can extend through the hole 122 to be coupled to the CPU 114. The conductor 302 can be coupled to the CPU 114 through any suitable means.

It is to be understood that the illustration of FIG. 3 is not intended to indicate that the motherboard 300 is to include all of the components shown in FIG. 3 in every case. Further, any number of additional components can be included within motherboard 300, depending on the details of the specific implementation.

Figure 4:
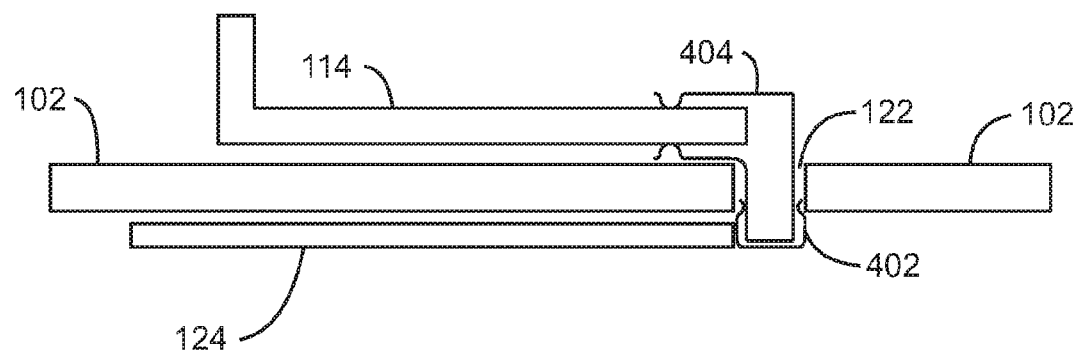
FIG. 4 is a further side view illustration of an example of a motherboard.

FIG. 4 is a side view illustration of an example of a motherboard 100. The motherboard 100 includes a PCB 102. The CPU 114 can be installed on the first surface of the PCB 102. The cable 124 can be routed on the second surface of the PCB 102. The cable 124 can be installed on the PCB 102 before the CPU 114 is installed. Further, the cable 124 can be installed before any of components 104-112 are installed.

A socket 402 can be coupled to the cable 124. The socket 402 can be coupled to the cable 124 through any suitable means, such as soldering or by compression. A single socket 402 or multiple sockets 402 can be coupled to the cable 124. For example, the cable 124 can include two ends and a socket 402 can be coupled to each end of the cable 124. The socket 402 can be coupled to the cable 124 before installation of the cable 124 on the PCB 102. In another example, the socket 402 can be coupled to the cable 124 after installation of the cable 124 on the PCB 102.

The socket 402 can be designed to receive an adapter 404 of any suitable type. For example, the socket 402 can be a vertical connector, as illustrated in FIG. 4. The adapter 404 can be coupled to the CPU 114 by any suitable means, such as by soldering. The adapter 404 can be coupled to the CPU 114 before installation of the CPU on the PCB 102. The adapter 404 can be designed to be received in the socket 402. For example, the adapter 404 can be a right-angled adapter, as illustrated in FIG. 4. During installation of the CPU 114 on the PCB 102, the adapter 404 can be inserted in the socket 402. The adapter 404 and the socket 402 can create a direct connection between the CPU 114 and the cable 124.

In another example, the socket 402 can include a plurality of compression pins, such as a land grid array (LGA) of compression pins. The socket 402 can include any suitable number of compression pins and the compression pins can be arranged in any suitable pattern. The adapter 404 can be designed to be received in the socket 402. For example, the adapter 404 can include a plurality of pads. The adapter 404 includes a number of pads equal to the number of compression pins included in the socket 402 and the pads can be arranged in a pattern corresponding to the pattern of the compression pins 204.

The adapter 404 can be coupled to the CPU 114 by any suitable means. In an example, the adapter 404 can include the compression pads and can be coupled to the CPU 114, such as by soldering. In another example, the adapter 404 can include the compression pads directly connected to a surface of the CPU 114. The adapter 404 can be coupled to the CPU 114 before installation of the CPU 114 on the PCB 102.

In an example, the socket 402 can be coupled to the cable and located at the bottom of the hole 122, on the second surface of the PCB 102, to receive the adapter 404. The adapter 404 can extend through the hole 122 to be received in the socket 402 during installation of the CPU.

It is to be understood that the illustration of FIG. 4 is not intended to indicate that the motherboard 400 is to include all of the components shown in FIG. 4 in every case. Further, any number of additional components can be included within motherboard 400, depending on the details of the specific implementation.

Figure 5:
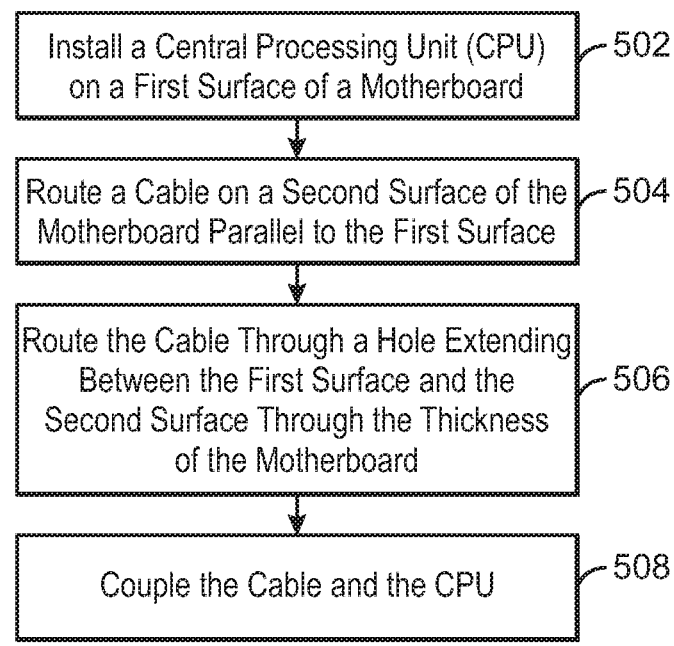
FIG. 5 is a process flow diagram of an example of a method of installing a central processing unit.

FIG. 5 is a process flow diagram of an example of a method of installing a CPU. The method can begin at block 502 with installing a central processing unit (CPU) on a first surface of a motherboard. The CPU can be installed with any suitable method.

At block 504, a cable can be routed on a second surface of the motherboard parallel to the first surface. The cable can be designed to connect to the CPU and can connect the CPU to another component. For example, the cable can connect the CPU to another CPU. In another example, the cable can connect the CPU to an input/output (I/O) device. The cable can be any type of cable designed to connect to the CPU, such as a flexible printed copper cable or a discrete wire. In an example, the cable can be a high-speed cable. The cable can include a housing, to insulate the conductors of the cable from the power and ground planes in the motherboard.

At block 506, the cable can be routed through a hole extending between the first surface and the second surface through the thickness of the motherboard. In an example, the entire cable can be routed through the hole. In another example, a portion of the cable housing can be removed and the conductors of the cable can be routed through the hole. In this example, the hole can be lined with an insulator to insulate the conductors of the cable from the power and ground planes of the motherboard.

In a further example, a socket can be coupled to the cable. The socket can be installed on the second surface side of the hole, without routing the cable through the hole. In another example, the cable can be routed through the hole and the socket can be coupled to the cable after the cable is routed through the hole, such that the socket is installed on the first side of the motherboard.

The socket can be coupled to the cable by any suitable method, such as by soldering or compression. In an example, the socket can be coupled to the cable before installation of the cable in the motherboard. The socket can be any type of socket. For example, the socket can be a vertical connector. In another example, the socket can be a land grid array (LGA) of compression pins. The cable can include more than one socket. For example, the cable can include two ends and two sockets, one socket coupled to each end of the cable. Further, the socket can include more than one type of socket. For example, in a cable with a socket coupled to each end of the cable, a first socket can be a first type of socket, such as a vertical connector, and a second socket can be a second type of socket, such as an array of compression pins.

At block 508, the cable and the CPU can be coupled. The cable and CPU can be coupled through any suitable method, such as soldering or compression. In an example, the CPU can include a coupled adapter. The adapter is designed to be received in the socket during installation of the CPU in the motherboard. For example, the adapter can be a right-angled adapter received in a vertical connector socket. In another example, the adapter can be an array of pads arranged in a pattern corresponding to the land grid array (LGA) of compression pins of the socket. In an example, the adapter can be inserted through the hole to be received in the socket positioned on the second side of the motherboard during installation of the CPU. In another example, the adapter can be received in a socket that is positioned on the first side of the motherboard and coupled to a cable routed through the hole.

It is to be understood that the process flow diagram of FIG. 5 is not intended to indicate that the method 500 is to include all of the blocks shown in FIG. 5 in every case. Further, any number of additional blocks can be included within the method 500, depending on the details of the specific implementation. In addition, it is to be understood that the process flow diagram of FIG. 5 is not intended to indicate that the method 500 is only to proceed in the order indicated by the blocks shown in FIG. 5 in every case. For example, block 504 can be rearranged to occur before block 502.

While the present techniques may be susceptible to various modifications and alternative forms, the exemplary examples discussed above have been shown only by way of example. It is to be understood that the technique is not intended to be limited to the particular examples disclosed herein. Indeed, the present techniques include all alternatives, modifications, and equivalents falling within the true spirit and scope of the appended claims.

What is claimed is:

1. A printed circuit board (PCB), comprising:
    a central processing unit (CPU) installed on a first surface of the PCB;
    a cable routed on a second surface of the PCB parallel to the first surface; and
    a hole extending through a thickness of the PCB to connect the first surface and the second surface,
    wherein the cable extends through the hole to be coupled to the CPU; and
    wherein the cable comprises a socket coupled to the cable and the CPU comprises an adapter coupled to the CPU, and the adapter extends through the hole to be received in the socket upon installation of the CPU on the motherboard.

2. The PCB of claim 1, wherein the hole comprises an insulating lining and wherein a conductor of the cable extends through the hole, without a cable housing, to be coupled to the CPU.

3. The PCB of claim 1, wherein the socket comprises a land grid array (LGA) of compression pins and the adapter comprises pads arranged in a land grid array (LGA) corresponding to the LGA of compression pins.

4. The PCB of claim 1, wherein the socket comprises a vertical connector and the adapter comprises a right-angled adapter that is received in the vertical connector.

5. The PCB of claim 1, wherein the cable comprises a flexible printed copper cable.

6. A motherboard, comprising:
    a first surface and a second surface parallel to the first surface;
    a hole extending through a thickness of the motherboard to connect the first surface and the second surface;
    a central processing unit (CPU) installed on the first surface; and
    a cable routed on the second surface,
    wherein the cable is routed through the hole to be coupled to the CPU; and
    wherein the cable comprises a socket coupled to the cable and the CPU comprises an adapter coupled to the CPU, and wherein the adapter extends through the hole to be received in the socket upon installation of the CPU on the motherboard.

7. The motherboard of claim 6, wherein the hole comprises an insulating lining and wherein a conductor of the cable extends through the hole, without a cable housing, to be coupled to the CPU.

8. The motherboard of claim 6, wherein the socket comprises a land grid array (LGA) of compression pins and the adapter comprises pads arranged in a land grid array (LGA) corresponding to the LGA of compression pins.

9. The motherboard of claim 6, wherein the socket comprises a vertical connector and the adapter comprises a right-angled adapter that is received in the vertical connector.

10. The motherboard of claim 6, wherein the socket is coupled to the cable by soldering.

11. The motherboard of claim 6, comprising multiple holes, each allowing a cable to pass through the motherboard for coupling to multiple components.

12. A method, comprising:
    installing a central processing unit (CPU) on a first surface of a motherboard;
    routing a cable on a second surface of the motherboard parallel to the first surface;
    routing the cable through a hole extending between the first surface and the second surface through a thickness of the motherboard; and
    coupling the cable and the CPU;
    wherein the cable comprises a socket coupled to the cable and the CPU comprises an adapter coupled to the CPU and wherein coupling the cable and the CPU comprises installing the CPU on the motherboard such that the adapter extends through the hole to be received in the socket.

13. The method of claim 12, further comprising removing a portion of cable housing and routing a cable conductor through the hole to couple the cable to the CPU.

14. The method of claim 13, wherein the hole comprises an insulating lining.

15. The method of claim 12, wherein the socket comprises a vertical connector and the adapter comprises a right-angled adapter that is received in the vertical connector.

16. The method of claim 12, comprising coupling an end of the cable opposite the end coupled to the CPU to another component.

17. The method of claim 12, comprising coupling an end of the cable opposite the end coupled to the CPU to another CPU, an input/output device or both.

* * * * *